(12) United States Patent
Menut et al.

(10) Patent No.: US 6,503,812 B2
(45) Date of Patent: Jan. 7, 2003

(54) FABRICATION PROCESS FOR A SEMICONDUCTOR DEVICE WITH AN ISOLATED ZONE

(75) Inventors: Olivier Menut, Grenoble (FR); Guillaume Bouche, Grenoble (FR); Herve Jaouen, Meylan (FR)

(73) Assignee: STMicroelectronics S. A., Montrouge (FR)

( * ) Notice: Subject to any disclaimer, the term of this patent is extended or adjusted under 35 U.S.C. 154(b) by 0 days.

(21) Appl. No.: 10/044,829

(22) Filed: Jan. 11, 2002

(65) Prior Publication Data

US 2002/0109188 A1 Aug. 15, 2002

(30) Foreign Application Priority Data

Jan. 12, 2001 (FR) .............................. 01 00416

(51) Int. Cl.[7] .............................................. H01L 21/76
(52) U.S. Cl. .......................................... 438/412; 438/413
(58) Field of Search ................................ 438/412, 413, 438/429

(56) References Cited

U.S. PATENT DOCUMENTS

| | | | |
|---|---|---|---|
| 4,507,158 A | * | 3/1985 | Kamins et al. ............. 148/175 |
| 4,575,925 A | * | 3/1986 | Kanbara et al. ......... 29/576 W |
| 4,710,794 A | | 12/1987 | Koshino et al. |
| 4,910,165 A | * | 3/1990 | Lee et al. ................... 438/413 |
| 5,091,330 A | | 2/1992 | Cambou et al. |
| 5,110,755 A | * | 5/1992 | Chen et al. ................. 438/413 |
| 5,637,513 A | * | 6/1997 | Sugiyama ................... 438/311 |
| 5,773,351 A | * | 6/1998 | Choi ........................... 438/429 |
| 6,204,098 B1 | * | 3/2001 | Anceau ...................... 438/149 |

FOREIGN PATENT DOCUMENTS

| | | | |
|---|---|---|---|
| EP | 0227523 | | 7/1987 |
| EP | 0391081 | | 10/1990 |
| JP | 57005328 | | 1/1982 |
| JP | 07066284 | * | 3/1995 .......... H01L/21/331 |

OTHER PUBLICATIONS

Arimoto, Yoshihiro, "Zone Melting Recrystallization for Dielectrically Isolated Bipolar Transistors," pp. 3289–3294, Journal of the Electrochemical Society, Manchester, New Hampshire, vol. 139, No. 11, Nov. 1992.

Preliminary Search Report dated Sep. 25, 2001 for French Application No. 0100416.

* cited by examiner

*Primary Examiner*—Olik Chaudhuri
*Assistant Examiner*—David S Blum
(74) *Attorney, Agent, or Firm*—Lisa K. Jorgenson; Jon A. Gibbons; Fleit, Kain, Gibbons, Gutman & Bongini P. L.

(57) ABSTRACT

The semiconductor device comprises a semiconductor substrate (SB) having locally at least one zone (ZL) terminating in the surface of the substrate and entirely bordered, along its lateral edges and its bottom, by an insulating material so as to be completely isolated from the rest of the substrate. The horizontal isolating layer may be a layer of constant thickness or a crenellated layer.

13 Claims, 6 Drawing Sheets

FABRICATION PROCESS FOR A SEMICONDUCTOR DEVICE WITH AN ISOLATED ZONE

CROSS REFERENCE TO RELATED APPLICATIONS

This application is based upon and claims priority from prior French Patent Application No. 0100416, filed Jan. 12, 2001, the disclosure of which is hereby incorporated by reference in its entirety.

BACKGROUND OF THE INVENTION

1. Field of the Invention

The present invention generally relates to semiconductor devices with silicon-on-insulator (SOI) substrates and more particularly to semiconductor devices formed with SOI isolation zones.

2. Description of Related Art

At the present time, the semiconductor substrate within which one or more integrated circuits are formed may be of various types. Thus, it is possible to form what is well known to those skilled in the art as a silicon-on-insulator (SOI) substrate. Such a silicon-on-insulator substrate is then formed from a silicon layer within which the integrated circuit or circuits will be formed, the silicon layer being isolated from the lower part of the semiconductor wafer by an insulating film, such as silicon dioxide. Integrated circuits, for example bipolar transistors for radio-frequency applications, are formed within such substrates. The performance of the integrated circuits are improved by an SOI-type isolation.

It is also possible to form so-called "conventional" semiconductor substrates, that is to say substrates of the bulk type, i.e. substrates within which there are active zones separated from other zones by isolating regions, for example of the STI (shallow trench isolation) type. Integrated circuits using an SOI-type structure, for example MOS transistors, are formed within such substrates.

At the present time, a semiconductor substrate able to include both zones entirely isolated by an insulating material, for example silicon dioxide, and "conventional" bulk-type zones is not known.

Accordingly, a need exists to provide a semiconductor substrate with both isolated regions i.e., "conventional" semiconductor bulk-type zones and SOI-type isolation zones.

SUMMARY OF THE INVENTION

The present invention provides both conventional bulk-type zones and SOI-type zones entirely isolated by an insulating material on the same semiconductor substrate. Stated differently, the present invention provides both zones entirely isolated by an insulating material and conventional bulk-type zones on the same semiconductor substrate or wafer.

The invention therefore provides a semiconductor device comprising a semiconductor substrate having locally at least one zone terminating in the surface of the substrate and entirely bordered, along its lateral edges and its bottom, by an insulating material so as to be completely isolated from the rest of the substrate.

According to one embodiment of the invention, the insulating material comprises a vertical isolating layer, bearing on the lateral edges of a local zone, and a horizontal isolating layer, of approximately constant thickness, bearing on the bottom of the zone and connected to the vertical isolating layer.

According to another embodiment off the invention, more particularly applicable to local zones of large width, the insulating material comprises a vertical isolating layer, bearing on the lateral edges of the local zone, and a crenellated horizontal isolating layer bearing on the bottom of the zone and connected to the vertical isolating layer.

In one embodiment, the substrate and the local zone are formed from silicon and the insulating material formed from silicon dioxide, or else from any insulating material, for example materials having a low dielectric constant.

The invention also provides a process for fabricating a semiconductor substrate comprising locally at least one zone terminating in the surface of the substrate and entirely bordered, along its lateral edges and its bottom, by an insulating material so as to be completely isolated from the rest of the substrate. The process according to the invention comprises:

a first step in which a horizontal layer is formed in an initial substrate, the horizontal layer being formed from the insulating material and terminating in the surface of the initial substrate;

a second step in which a semiconductor layer called a covering layer is formed on the surface of the initial substrate and on the surface of the horizontal layer; and a third step in which a vertical layer formed from the insulating material is formed in the semiconductor covering layer, the vertical layer being connected to the isolating horizontal layer and terminating in the surface of the semiconductor covering layer. That part of the semiconductor covering layer bordered externally by the horizontal and vertical layers of the insulating material then forms the local zone completely isolated from the rest of the substrate.

According to a first method of implementing the invention, an isolating horizontal layer of approximately constant thickness is formed in the first step.

In this regard, the formation of the horizontal layer advantageously includes the formation of a trench in the initial substrate and the filling of the trench with the insulating material.

According to another method of implementing the invention, a crenellated isolating horizontal layer is formed in the first step.

In this regard, the formation of the crenellated isolating horizontal layer advantageously comprises the following sub-steps:

the formation in the initial substrate of a row of several first adjacent trenches mutually separated by first portions of the initial substrate;

the filling of the first trenches with the insulating material;

the formation of a semiconductor layer, called an intermediate layer, on the initial substrate and on the filled first trenches;

the formation of a row of several second adjacent trenches in the intermediate semiconductor layer, the second trenches being mutually separated by second portions of the intermediate semiconductor layer, at least some of the second trenches bearing on two immediately adjacent first trenches and on the first portion of the initial substrate separating these two immediately adjacent first trenches, respectively; and the filling of the second trenches with the insulating material.

The intermediate semiconductor layer may be formed by epitaxy. Moreover, in order to ensure the minimum number of defects during the epitaxy, it is preferable that the formation of this intermediate semiconductor layer comprise a phase of amorphizing the surface of the initial substrate, the deposition of an auxiliary semiconductor layer on the amorphous surface of the initial substrate and on the filled first trenches, a phase of recrystallizing the auxiliary. semiconductor layer and the epitaxy of the intermediate semiconductor layer on the crystallized auxiliary layer.

Whatever the implementation variants used, the formation of the semiconductor covering layer may also comprise epitaxy. However, also for the purpose of minimizing the defects in the epitaxially grown structure, it is preferable that this epitaxy be preceded by a phase of amorphizing and of recrystallizing an auxiliary semiconductor layer. More specifically, if the horizontal isolating layer is an isolating layer of approximately uniform thickness, the formation of the semiconductor covering layer advantageously comprises a phase of amorphizing the surface of the initial substrate, the deposition of an auxiliary semiconductor layer on the amorphous surface of the initial substrate and on the filled trench, a phase of recrystallizing the auxiliary semiconductor layer and the epitaxy of the semiconductor covering layer on the recrystallized auxiliary semiconductor layer.

If the horizontal isolating layer is a crenellated layer, formation of the semiconductor covering layer advantageously comprises a phase of amorphizing the surface of the intermediate semiconductor layer, the deposition of an auxiliary semiconductor layer on the amorphous surface of the intermediate semiconductor layer and on the filled second trenches, a phase of recrystallizing the auxiliary semiconductor layer and the epitaxy of the semiconductor covering layer on the recrystallized auxiliary semiconductor layer.

Whatever the variants used, in the third step of the process according to the invention, the formation of the vertical isolating layer comprises, for example, the formation of a trench and the filling of the trench with the insulating material.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1A:
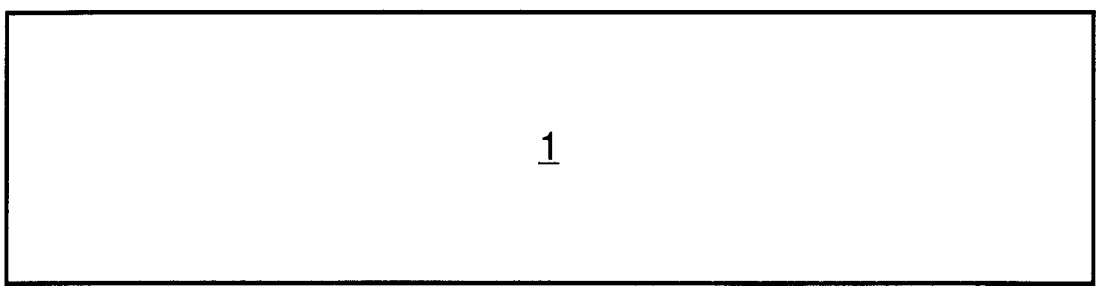
FIGS. 1a to 1e illustrate schematically the main steps of a first method of implementing a process according to the invention, making it possible to obtain a first embodiment of a device according to the invention.
Figure 1B:
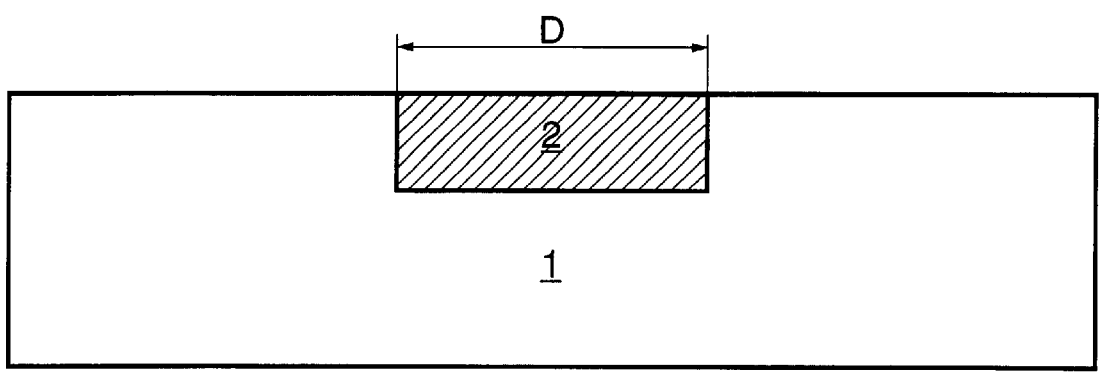

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

In FIG. 1a, the label 1 denotes an initial semiconductor substrate, for example made of silicon.

In this initial substrate 1 is formed, in a conventional manner known per se, a shallow trench 2 having, for example, a depth of about 0.35 microns which is filled with an insulating material, for example silicon dioxide.

The trench is formed, for example, by dry etching. Fine reoxidation of the walls of the trench is then carried out by heating in a furnace. Next, the trench is filled, for example by chemical vapor deposition (CVD) of $SiO_2$.

In such an embodiment, the width D of the trench is preferably less than 1 or 2 microns, for example of the order of a few tenths of a micron.

Figure 1C:
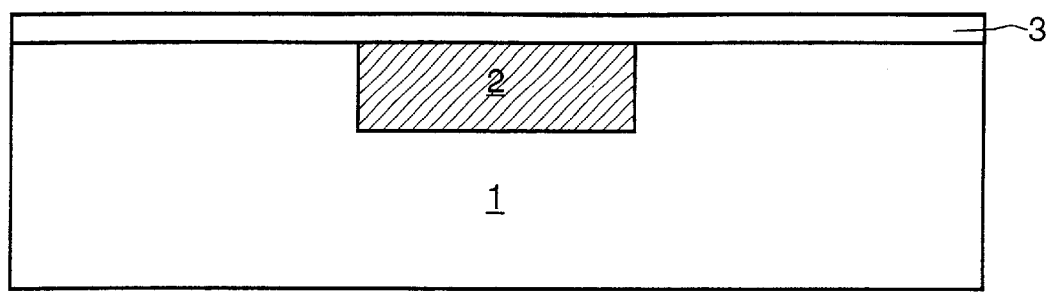

An amorphization treatment is then carried out over the entire surface of the substrate or wafer. The purpose of such a treatment is to make the substrate lose its crystalline structure. Such a treatment is carried out, for example, by silicon, germanium or neon implantation. Next, as illustrated in FIG. 1c, a semiconductor layer called the auxiliary layer 3 is deposited, this being formed by a thin film of silicon. Such deposition may also be carried out, for example, by CVD.

The process then continues with a phase of recrystallizing this auxiliary semiconductor layer 3, for example by placing the structure illustrated in FIG. 1c in a high-temperature furnace, for example at a temperature of greater than or equal to 550° C., for about half an hour.

It should be noted here that the dimension D, which was chosen to be less than or equal to 1 or 2 microns, makes it possible to obtain a correctly recrystallized layer 3 over the entire surface of the filled isolating trench 2.

Figure 1D:
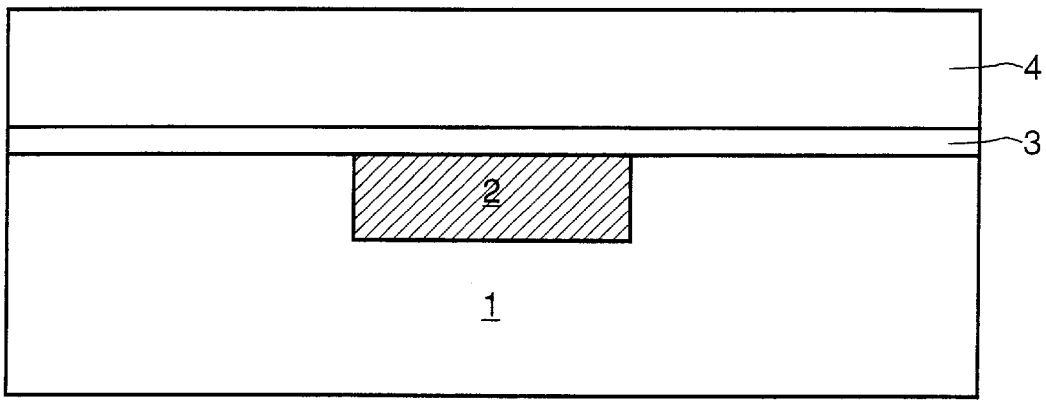

Next, a semiconductor layer 4, called the covering layer, is grown by conventional epitaxy (FIG. 1d). The thickness of such a covering layer is, for example, about 2 to 3 microns.

Because of the presence of there crystallized auxiliary layer 3, the covering layer 4 has a single-crystal structure.

Figure 1E:
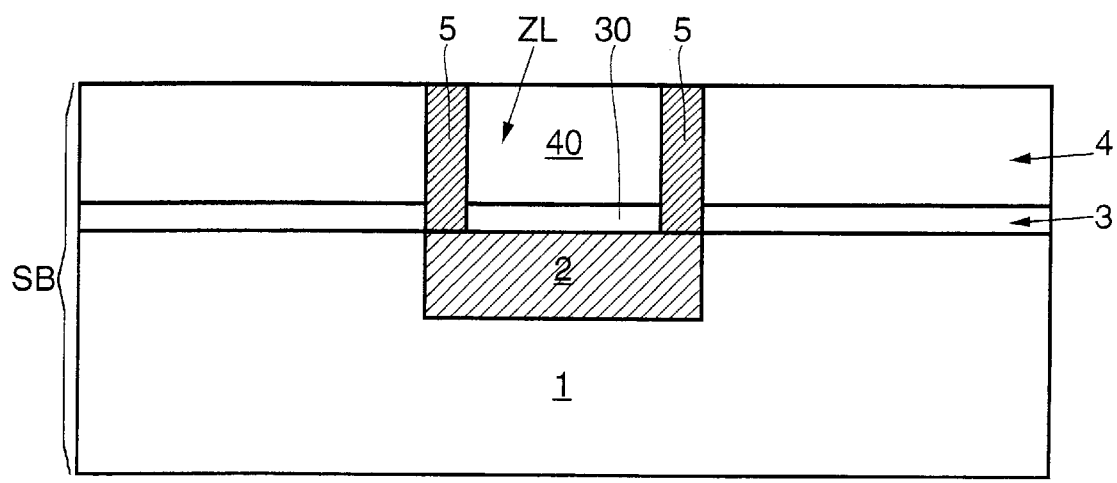

Next, as illustrated in FIG. 1e, a peripheral vertical trench is formed in the covering layer 4, for example by dry etching, the trench then being filled with insulating material 5 in a manner similar to that described for the filling of the trench 2. A filled isolating vertical trench 5, which bears on the upper surface of the trench 2, is then obtained.

Thus, as illustrated in FIG. 1e, the semiconductor device according to the invention comprises a semiconductor substrate SB formed from the initial substrate 1 and from the layers 3 and 4. This substrate includes locally a zone ZL terminating in the surface of the substrate and entirely bordered, along its lateral edges and its bottom, by an insulating material. The zone ZL is thus completely isolated from the rest of the substrate. More specifically, the insulating material comprises a vertical isolating layer 5 bearing on the lateral edges of the zone ZL and a horizontal isolating layer 2, of approximately constant thickness, bearing on the bottom of the zone ZL and connected to the vertical isolating layer 5. The zone ZL is formed by the portion 30 of the layer 3 and by the portion 40 of the layer 4.

In the example described here, the layer 5 bears on the layer 2. It would also have been possible to etch the substrate 1 so that the layer 5 is connected to the layer 2 along its vertical lateral edges.

For lower isolating layers of larger width, for example of greater than 1 or 2 microns, it will be preferable to use the method of implementation illustrated in FIGS. 2a to 2h, this method now being described in greater detail.

Figure 2A:
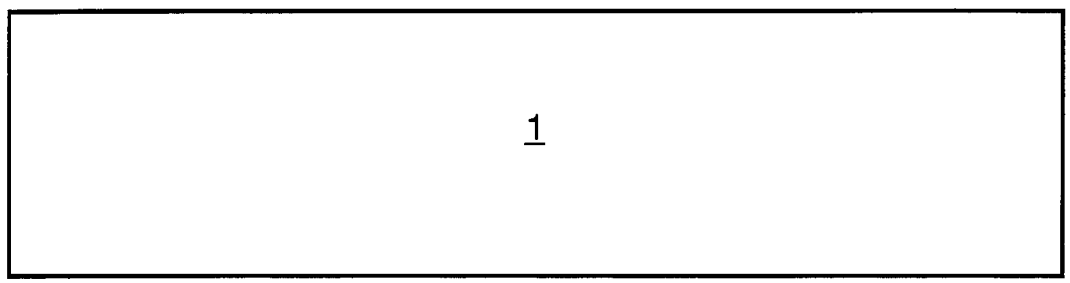
FIGS. 2a to 2h illustrate schematically the main steps of a second method of implementing a process according to the invention, making it possible to obtain a second embodiment of a device according to the invention.
Figure 2B:
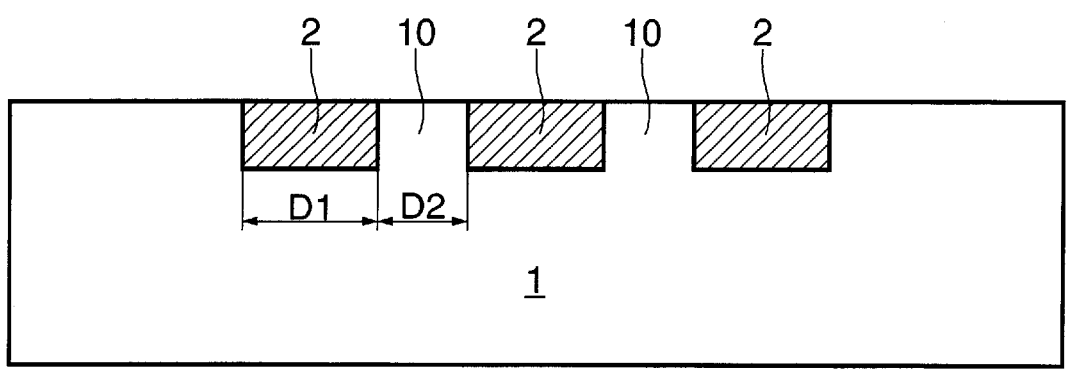
Figure 2C:
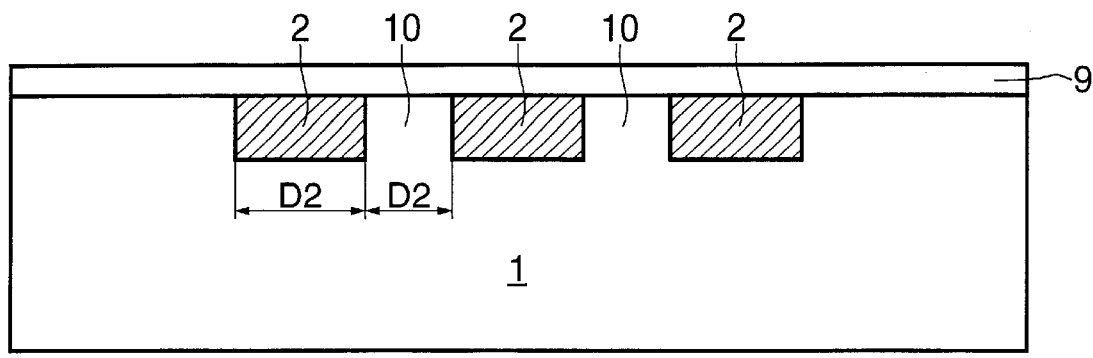
Figure 2D:
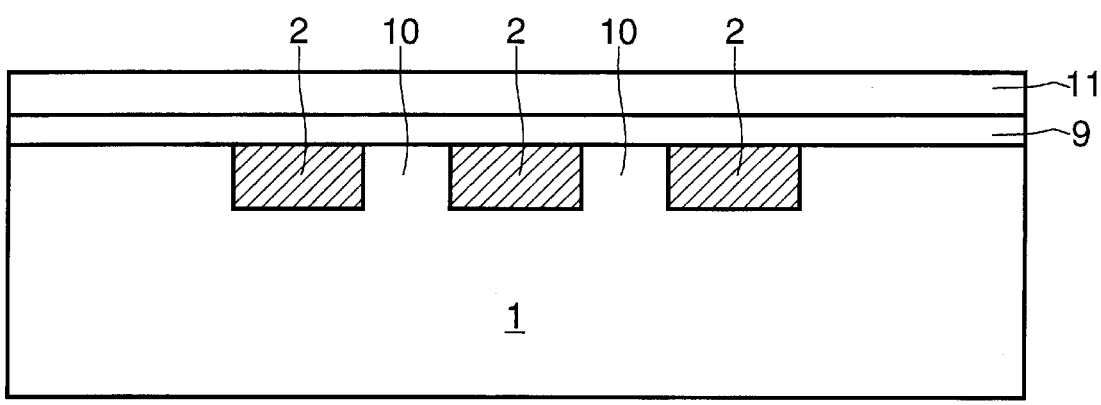

Here again, as illustrated in FIG. 2a, the process starts with an initial semiconductor substrate 1 in which a row of several adjacent first trenches 2 is formed (FIG. 2b), the first trenches being mutually separated by the first portions 10 of the initial substrate. The example described here shows three trenches having widths D1 of about 0.5 microns for example and spaced apart by a distance D2 of about 0.2 microns for example. The depth of the trenches is of the order of a few tenths of a micron, for example 0.35 microns.

After having formed these trenches in a manner similar to that described above in the case of the first method of implementation, they are also filled with insulating material, for example $SiO_2$, in a manner similar to that described above in the case of the first method of implementation.

Next, an auxiliary semiconductor layer 9 is formed (FIG. 2c) on the initial substrate 1 and on the filled first trenches 2. The auxiliary layer 9 is formed, for example, in a manner similar to that described with reference to FIG. 1c in the case of the formation of the auxiliary semiconductor layer 3. In other words, the process provides a phase of amorphizing the substrate followed by deposition of the layer 9 and recrystallization thereof.

It should be noted here that the fact of having sufficiently narrow and mutually separated trenches 2 makes it possible to obtain good recrystallization of the layer 9, especially above the isolating trenches 2. This would not have been the case if a single trench of much greater width had been formed.

Next, an intermediate semiconductor layer 11 is formed (FIG. 2d), for example by epitaxy, and then the layer 11 and the layer 9 are etched so as to form a row of several adjacent second trenches 20 mutually separated by second portions 110 of the intermediate semiconductor layer and by second portions 90 of the auxiliary layer 9. The trenches 20 are then filled with the insulating material. The formation of the trenches 20 and their filling are carried out in a manner similar to the formation of the trenches 2 and to their filling. In this regard, it will be chosen to grow a layer 11 epitaxially over a height of approximately 0.30 to 0.35 microns.

Some of these second trenches 20 bear on two immediately adjacent first trenches 2 and on that portion 10 of the initial substrate which separates these two immediately adjacent first trenches, respectively. Thus, a crenellated horizontal isolating layer is formed.

Figure 2E:
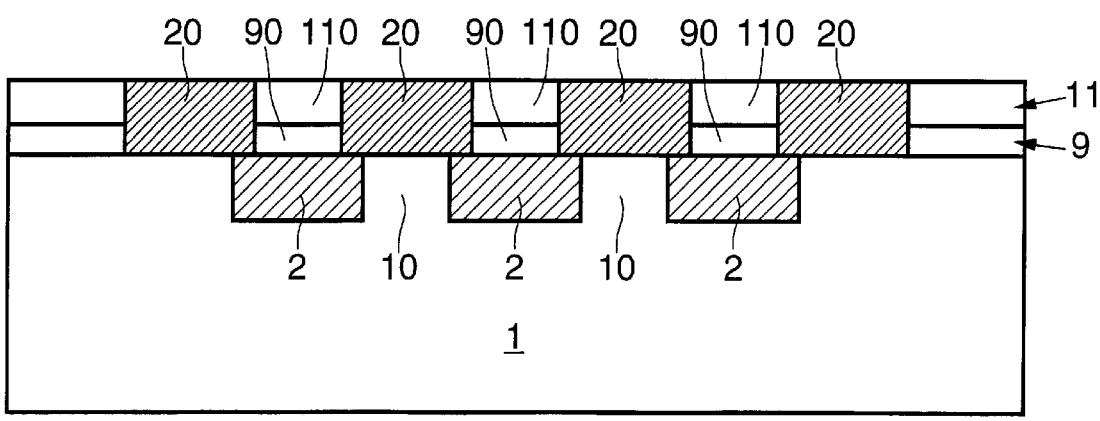
Figure 2F:
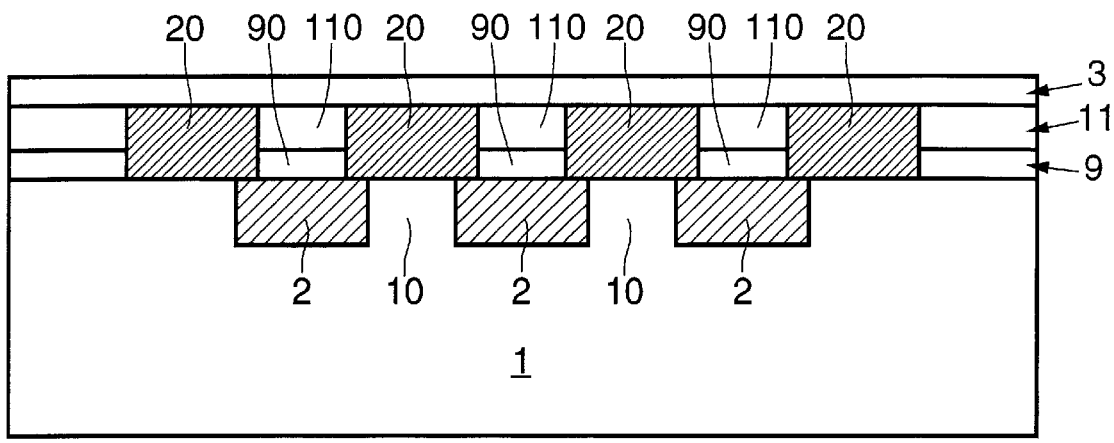
Figure 2G:
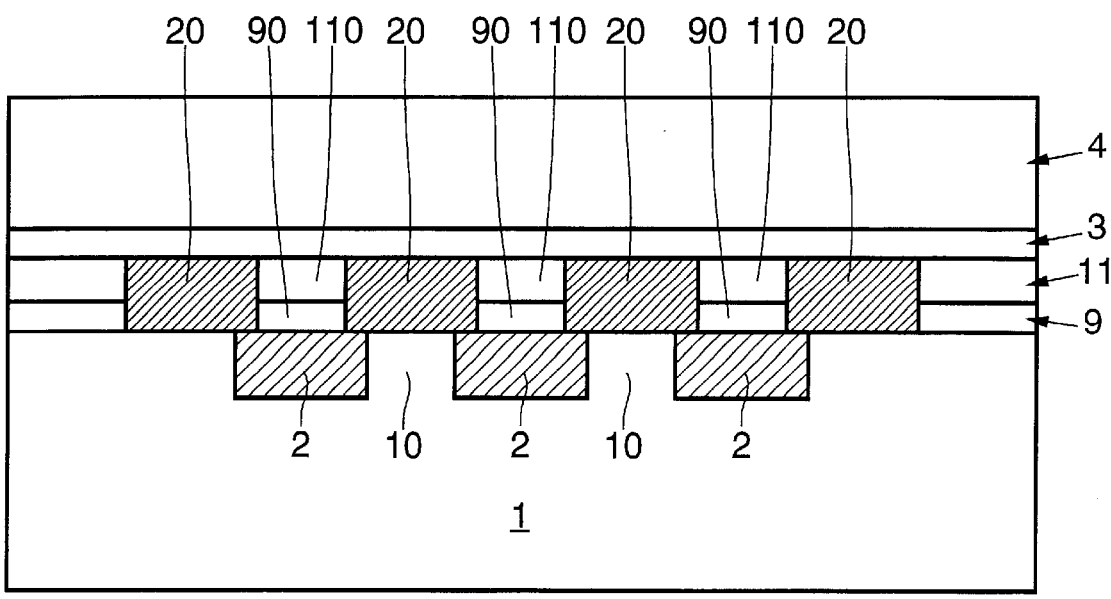

Of course, it would have been possible to form four trenches 2 and three trenches 20 instead of three trenches 2 and four trenches 20 as illustrated in FIG. 2e. Next (FIG. 2f), an auxiliary semiconductor layer 3 is formed in a manner similar to the way in which the auxiliary layer 9 is formed. The process then continues, as illustrated in FIG. 2g, with epitaxial growth of the semiconductor covering layer 4 before isolating vertical trenches 5 (FIG. 2h) bearing on trenches 20 of the lower crenellated isolating layer are formed. The formation of the vertical trenches 5 is carried out in a manner similar to that described with reference to FIG. 1e.

Figure 2H:
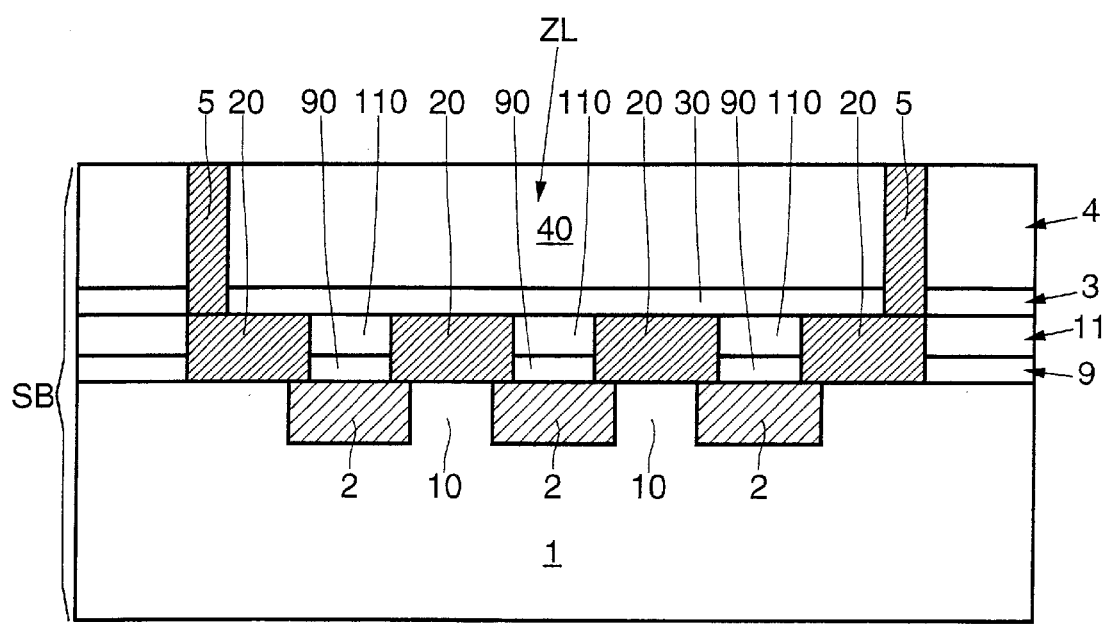

Thus, as illustrated in FIG. 2h, the semiconductor zone ZL completely isolated from the rest of the substrate is formed from the portion 30 of the layer 3, from the portion 40 of the layer 4 and from the portions 90 and 110 of the layers 9 and 11. The zone is entirely bordered along its lateral edges by the vertical isolating layer 5 and along its bottom by the crenellated horizontal isolating layer, formed from the two rows of trenches 2 and 20.

The invention applies to any technology whatsoever and to any semiconductor device whatsoever. Furthermore, the isolation of the bottom of the local zone ZL is carried out right at the beginning of the process, thereby having no subsequent impact on the formation of the subsequent integrated circuits.

Moreover, the various cleaning, amorphizing and recrystallizing phases are optional and simply make it possible to obtain superior quality of the subsequent epitaxy. This being the case, in some applications and other embodiments in which the crystal defects are of lesser importance, the covering layer and the intermediate layer could be grown epitaxially directly on the filled trench or trenches.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for fabricating a semiconductor substrate with at least one zone terminating in a top surface of the substrate, the zone includes two or more lateral edges and a bottom surrounded by an insulating material so as isolate the zone from. the substrate, the process comprising the steps of:

forming a horizontal layer with a top surface in a substrate, the horizontal layer being formed from an insulating material and terminating in the top surface of the substrate;

forming a semiconductor covering layer with a top surface over the top surface of the substrate and on the top surface of the horizontal layer; and forming a vertical layer from the insulating material in the semiconductor covering layer, the vertical layer being connected to the horizontal layer and terminating in the top surface of the semiconductor covering layer, whereby the semiconductor covering layer is bordered externally by the horizontal layer and the vertical layer of the insulating material so as to form a zone.

2. The process according to claim 1, wherein the step forming a horizontal layer includes forming an isolating horizontal layer of approximately constant thickness.

3. The process according to claim 2, wherein the step of forming a horizontal layer includes the sub-steps of:

forming a trench in the substrate; and filling the trench with the insulating material.

4. The process according to claim 1, wherein the step of forming a horizontal layer includes forming a crenellated horizontal isolating layer.

5. The process according to claim 4, wherein the step of forming a crenellated horizontal isolating layer further includes the sub-steps of:

forming in the substrate a row of several first adjacent trenches mutually separated by first portions of the substrate;

filling of the first trenches with the insulating material;

forming an intermediate semiconductor layer on the substrate and on the first trenches which have been filled;

forming a row of several second adjacent trenches in the intermediate semiconductor layer, the second trenches being mutually separated by second portions of the intermediate semiconductor layer, at least some of the second trenches bearing on two immediately adjacent first trenches and on the first portion of the substrate separating these two immediately adjacent first trenches, respectively; and filling the second trenches with the insulating material.

6. The process according to claim 5, wherein the sub-step of forming the intermediate semiconductor layer includes forming the intermediate semiconductor layer using epitaxy.

7. The process according to claim 6, wherein the sub-step of forming the intermediate semiconductor layer includes the sub-steps of:

amorphizing the surface of the substrate;

depositing an auxiliary semiconductor layer on the surface of the substrate which has been amorphized;

recrystallizing the auxiliary semiconductor layer; and growing epitaxially the intermediate semiconductor layer on the auxiliary semiconductor layer which has been recrystallized.

8. The process according to claim 1, wherein the step of forming a semiconductor covering layer includes forming a semiconductor covering layer using epitaxy.

9. The process according to claim 7, wherein the step of forming a semiconductor covering layer includes forming a semiconductor covering layer using epitaxy.

10. The process according to claim 9, wherein the step of forming a horizontal layer further comprises the sub-steps of:

forming a trench in the substrate;

filling the trench with the insulating material;

forming the semiconductor covering layer further includes the sub-steps of:

forming a semiconductor covering layer using epitaxy and further including the sub-steps of:

amorphizing the surface of the substrate;

depositing an auxiliary semiconductor layer on the trench and on the surface of the substrate which has been amorphized;

recrystallizing the auxiliary semiconductor layer; and growing epitaxy the semiconductor covering layer on the recrystallized auxiliary semiconductor layer.

11. The process according to claim 5, wherein the step of forming a covering layer includes forming a covering layer using epitaxy and wherein the step of forming the semiconductor covering layer further includes the sub-steps of:

amorphizing the surface of the intermediate semiconductor layer;

depositing of an auxiliary semiconductor layer on the on the second trenches with have been filled and on the amorphous surface of the intermediate semiconductor layer;

recrystallizing the auxiliary semiconductor layer; and growing epitaxially the semiconductor covering layer on the auxiliary semiconductor layer which has been recrystallized.

12. The process according to claim 1, wherein the step of forming a vertical layer further includes the sub-steps:

forming a trench; and filling of the trench with the insulating material.

13. The process according to claim 11, wherein the step of forming a vertical layer further includes the sub-steps:

forming a trench; and filling of the trench with the insulating material.

* * * * *